(12) United States Patent
Ye et al.

(10) Patent No.: US 11,327,326 B2
(45) Date of Patent: May 10, 2022

(54) REAL-TIME MICRO/NANO OPTICAL FIELD GENERATION AND MANIPULATION SYSTEM/METHOD

(71) Applicant: Soochow University, Suzhou (CN)

(72) Inventors: Yan Ye, Suzhou (CN); Yishen Xu, Suzhou (CN); Linsen Chen, Suzhou (CN)

(73) Assignee: Soochow University, Suzhou (CN)

( * ) Notice: Subject to any disclaimer, the term of this patent is extended or adjusted under 35 U.S.C. 154(b) by 181 days.

(21) Appl. No.: 16/628,549

(22) PCT Filed: Nov. 27, 2017

(86) PCT No.: PCT/CN2017/113093
§ 371 (c)(1),
(2) Date: Jan. 3, 2020

(87) PCT Pub. No.: WO2019/015194
PCT Pub. Date: Jan. 24, 2019

(65) Prior Publication Data
US 2020/0218078 A1 Jul. 9, 2020

(30) Foreign Application Priority Data
Jul. 18, 2017 (CN) .......................... 201710587322.4

(51) Int. Cl.
*G02B 27/09* (2006.01)
*G02B 5/00* (2006.01)
*G02B 5/20* (2006.01)

(52) U.S. Cl.
CPC .......... *G02B 27/0988* (2013.01); *G02B 5/005* (2013.01); *G02B 5/20* (2013.01)

(58) Field of Classification Search
CPC ....... G02B 27/0988; G02B 5/005; G02B 5/20
See application file for complete search history.

(56) References Cited

U.S. PATENT DOCUMENTS 7,697,191 B2 * 4/2010 Gluckstad .............. G02B 27/52
359/279

* cited by examiner

*Primary Examiner* — Robert E. Tallman
(74) *Attorney, Agent, or Firm* — Wang Law Firm, Inc.

(57) ABSTRACT

The present disclosure discloses a real-time micro/nano optical field generation and manipulation system and method. The system comprises a light source, a spatial filtering unit, an optical 4F system and a light wave manipulation unit, and the optical 4F system comprises a first lens (set) and a second lens (set) sequentially arranged along a light path. The present disclosure achieves real-time modulation on an incident wavefront through a phase element or a phase element assemble. By dynamically manipulating an incident light sub-wavefront, or the light wave modulation optical element, or different areas of the optical element, or different parts of the optical field in an imaging plane and/or the like by the spatial filtering unit, real time light fields with different parameters are generated in the image plane of the system. By spatial filtering/spatial time division filtering/ spatio-temporal multiplexing filtering and/or the change of the phase elements, flexible manipulation on patterns, pattern distribution areas and structural parameters such as the patterns' frequency, their orientations, duty ratios, phases or phase shifts and the like are realized. The system can be flexibly integrated into various lithography or microscopy systems for real-time micro/nano structure fabrication and dynamical or 3D detection with a real time manipulated structural illumination.

8 Claims, 4 Drawing Sheets

REAL-TIME MICRO/NANO OPTICAL FIELD GENERATION AND MANIPULATION SYSTEM/METHOD

TECHNICAL FIELD

The present disclosure relates to a real-time micro/nano optical field generation and manipulation system and method, particularly to a real-time micro/nano optical field generation and manipulation system where spatial filter or spatio-temporal multiplexing filter or phase device is utilized, and multiple sub-wavefronts are modulated flexibly in real time, which can be applied for micro/nano structure fabrication, laser confocal microscopic imaging, bioluminescence detection and micro/nano morphological detection.

BACKGROUND

Interference lithography or holographic lithography is an efficient fabrication technique for a large area micro/nano structure, and the period of the micro/nano structure fabricated by the interference lithography is determined by the wavelength and intersection angle of interference beams (the period is proportional to the interference wavelength and inversely proportional to the sine value of the intersection angle between the interference beams); the orientation of the micro-nano structure is determined by the wave vector of the interference beams; and the phase distribution of the fringe is determined by the relative phase difference of the interference beams. The interference lithography can be freely combined with other technologies such as vapor deposition, etching and so on, which provides a foundation for the application of micro-nano structures in photonic crystals, biomedicines, microelectronics and other fields.

The interference lithography system is classified into an amplitude-splitting interference system and a wavefront-splitting interference system, and the two systems split an incident light into two or more coherent beams for interference by a light-splitting device, such as a half mirror, a prism, a grating, a diffractive mask and a Lloyd's mirror, etc. Once the interference lithography system is set up, the structural parameters of the produced micro/nano structure are fixed, which cannot be changed in real time. Even with a gimbal mirror, the period of the micro/nano structure can only be changed in a limited range. While realizing real-time change in both period and orientation, its corresponding optical configuration is complex.

For the micro/nano structure's frequency manipulation, U.S. Pat. No. 5,132,812 and the improvement thereof U.S. Pat. Nos. 5,262,879, 5,822,092 and 5,132,812 use an interference of three sets of beams with different intersection angles to form three grating pixels with different spatial frequencies, realizing discrete manipulation of the spatial frequencies of a grating. Chinese patents CN01134127.0, CN200510095775.2, CN200510095776.2, CN201010238377.2, and CN201010503788.X disclose a method to achieve discrete manipulation of the spatial frequencies by switching gratings with different spatial frequencies, where these different binary gratings act as light-splitting elements.

However, at present, for novel devices based on various micro/nano structures, such as the novel color display, true color 3D display and metasurface materials, a lithography system is required to fabricate space variant structures with different parameters such as period, orientation, duty cycle and even pattern in real time.

SUMMARY

The present disclosure is to provide a real-time micro/nano optical field generation and manipulation system and method, which can be flexibly integrated into various lithography systems to realize real-time fabrication of micro/nano structures, and can also be integrated into various microscopic systems to provide the flexible structural illumination.

In order to achieve the object, the present disclosure provides a technical solution as follows:

an embodiment of the present disclosure discloses a real-time micro/nano optical field generation and manipulation system, comprising a light source, a spatial filtering unit, an optical 4F system and a light wave manipulation unit, wherein the optical 4F system comprises a first lens (set) and a second lens (set) arranged sequentially along a light path, the light wave manipulation unit is arranged between the first lens (set) and a second lens (set), which modulates incident lights or its sub-wavefronts separately; the spatial filtering unit is located in front of or at the back of the optical 4F system, which manipulates an incident light wavefront, or/and selects light wave manipulation unit or/and the pixel's effective area, or/and filters optical field in the image plane. Therefore, optical field distribution with real-time adjustable patterns, pattern positions, pattern areas and pattern structural parameters can be generated in a back focal plane of the system.

Preferably, in the real-time micro/nano optical field generation and manipulation system, the characteristics of the pattern include its composition, position, occupation area and so on. The structural parameters of the pattern comprise one or kinds of period/frequency, orientation, phase or phase shift, or/and duty cycle.

Preferably, in the real-time micro/nano optical field generation and manipulation system, the optical field distribution is formed by one or more interference optical fields.

Preferably, in the real-time micro/nano optical field generation and manipulation system, the composition, position, area, and structural parameters of the pattern are separately or simultaneously adjustable in real time with continuous changes.

Preferably, in the real-time micro/nano optical field generation and manipulation system, the light wave manipulation unit is selected from any method as follows:

(a). the light wave manipulation unit is a single phase element, modulates incident lights by change and/or rotation of the phase element, and/or limits/selects an incident optical field or an output optical field by spatial light filters/apertures. And optical field distribution with adjustable positions, areas and structural parameters are achieved;

(b). the light wave manipulation unit is a phase element with spatial variant structures, and the phase element at least comprises two different structured sub-pixels, wherein different sub-pixels are selected through the spatial filtering unit to manipulate the sub-wavefront of an incidence, generates an output optical field distribution with different patterns, pattern positions and pattern areas in the back focal plane of the system; and each or selected incident sub-wavefront is manipulated by time division spatial filtering and/or spatio-temporal multiplexing filtering and/or phase elements change and/or displacement and/or rotation, which generates an output optical field distribution with real-time adjustable structural parameters in the back focal plane of the system;

(c). the light wave manipulation unit is a phase element with spatial variant structures, and the phase element at least comprises two different structured sub-pixels/sub-elements, wherein different parts of the sub-pixels are selected to manipulate of each incident sub-wavefront. Thereof optical field distribution with different patterns, pattern positions and pattern areas in the back focal plane of the system is generated; and each or selected incident sub-wavefront is manipulated by time division spatial filtering and/or spatio-temporal multiplexing filtering and/or phase elements displacement and/or rotation, which generates an output optical field distribution with real-time adjustable structural parameters in the back focal plane of the system;

(d). the light wave manipulation unit is a phase element with spatial variant structures, and the phase element at least comprises two differently structural distributed sub-pixels, the sub-pixels modulate sub-wavefronts of an incidence to output multiple interference optical field. Different parts of the interference optical fields in the imaging plane are selected by the spatial filtering unit so as to generate optical field distribution with different patterns, pattern positions and pattern areas, and each or selected sub-wavefront of the optical field can be modulated by time division spatial filtering and/or phase element phase change and/or rotation, and generates the optical field distribution with adjustable structural parameters;

(e). the light wave manipulation unit is multiple separated phase elements. Different parts of an incident optical field are selected by the spatial filtering unit, and each sub-wavefront part is modulated by the phase elements to output multiple interference optical fields so as to generate optical field distribution with different patterns, pattern positions and pattern areas in the back focal plane of the system; the output optical field distribution with patterns and structural parameters is adjusted with each or selected incident sub-wavefront manipulated by time division spatial filtering and/or phase element phase change and/or rotation, and generates the optical field distribution with adjustable patterns and structural parameters in the back focal plane of the system;

(f). the light wave manipulation unit is multiple separated phase elements, and the different areas of the phase elements are selected by the spatial filtering unit to output multiple interference optical fields so as to generate optical field distribution with different patterns, pattern positions and pattern areas; each/or selected incident sub-wavefront is modulated by time division spatial filtering and/or phase element phase change and/or rotation, and generates the optical field distribution with real-time adjustable patterns and structural parameters in the back focal plane of the system; and (g). the light wave manipulation unit is multiple separated phase elements, and each phase element modulates the sub-wavefront of the incident light to output multiple interference optical fields; different interference optical fields in an imaging plane are selected through the spatial filtering unit so as to generate optical field distribution with different patterns, pattern positions and pattern areas; each or selected incident sub-wavefront is manipulated by time division spatial filtering and/or phase element phase change and/or rotation, and generates the optical field distribution with real-time adjustable patterns and structural parameters in the back focal plane of the system.

Preferably, in the real-time micro/nano optical field generation and manipulation system, the spatial filtering unit is selected from a diaphragm/aperture, a gray-scale mask or a programmable spatial filtering unit.

Preferably, in the real-time micro/nano optical field generation and manipulation system, the filtering method of the spatial filtering unit comprises and is not limited to a time division multiplexing filter or spatio-temporal multiplexing filter.

Preferably, in the real-time micro/nano optical field generation and manipulation system, the light source comprises a laser.

The present disclosure further discloses a dynamic manipulation method based on the real-time micro/nano optical field generation and manipulation system.

Compared with the prior art, the present disclosure has the following advantages:

(1). the spatial filtering unit real-time selects the incident sub-wavefronts, the phase element area, the parts of the optical field in the imaging plane, the patterns, the pattern' positions and pattern' occupied areas;

(2). real-time manipulation of the patterns, the pattern positions and the pattern areas and/or continuous manipulation of the structural parameters are achieved through the spatial filtering and/or time division multiplexing;

(3). continuous manipulation of one-dimensional structural parameters of the patterns is achieved through the spatial filtering unit and the movement of the phase element; and (4). separately or simultaneously continuous manipulation of the patterns and/or the pattern structural parameters is achieved through the change of the spatial filtering unit and the phase element.

In conclusion, the present disclosure utilizes the spatial filtering unit and the light wave manipulation unit to realize real-time modulation in the output light fields. Different incident sub-wavefronts, or the phase element areas and/or the optical fields in the imaging plane and/or the like is selected by the spatial filter to fabricate various complex micro/nano structures; By the time division spatial filtering, or the time division complexing spatial filtering, or/and phase element relative motion, the structure parameters can be continuously adjusted in real time; the real-time micro/nano optical field generation and manipulation system can be flexible integrated into a variety of microscopic systems.

BRIEF DESCRIPTION OF THE DRAWINGS

In order to illustrate the embodiments of the present disclosure or the technical solutions in the prior art more clearly, the drawings required for use in the description of the embodiment or the prior art will be simply introduced below; obviously, the drawings described below are merely some of the embodiments recorded in the present disclosure, and for a person ordinarily skilled in the art, other drawings may be also obtained according to these drawings without involving any inventive effort.

FIGS. 1 (c) shows increase of corresponding frequency/base frequency after the movement of the phase element when the spatial filtering selects different incident sub-wavefronts.

FIG. 3 (a) shows the real-time generation of the micro/nano optical field by the spatial filter; and FIG. 3 (b) shows the real-time generation of the micro/-nano optical field with the spatial filter and relative motion of the phase elements.

FIG. 4 (a) shows filtering selection of high-spatial-frequency/base-frequency patterns and their positions in an imaging plane; and FIG. 4 (b) shows low-spatial-frequency/base-frequency and variable-orientation patterns and their positions in an imaging plane.

DESCRIPTION OF THE EMBODIMENTS

The following describes the technical solutions in the embodiments of the present disclosure in detail with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

Figure 1:
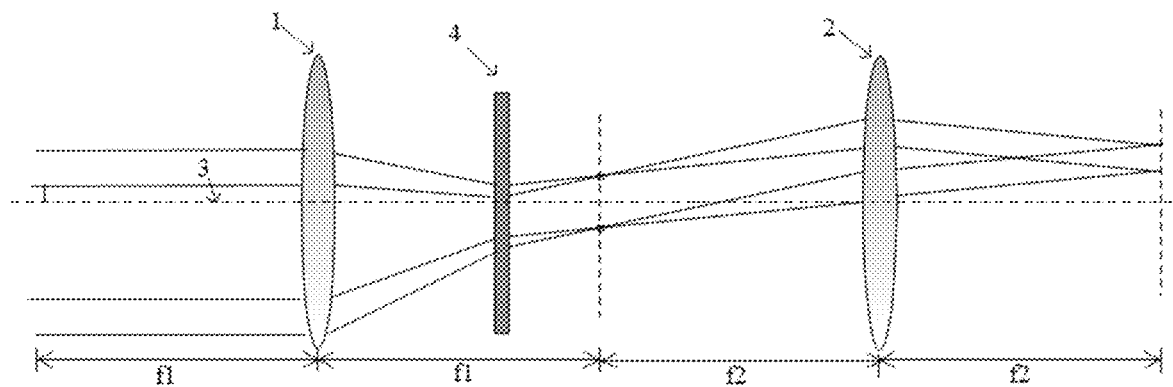
FIG. 1 shows a real-time micro/nano optical field generation system incorporating the spatial filter and a single phase element in Embodiment 1 of the present disclosure; wherein FIGS. 1 (a) and (b) show a position change of an obtained pattern with spatial filter selects different incident sub-wavefronts.
Figure 1:
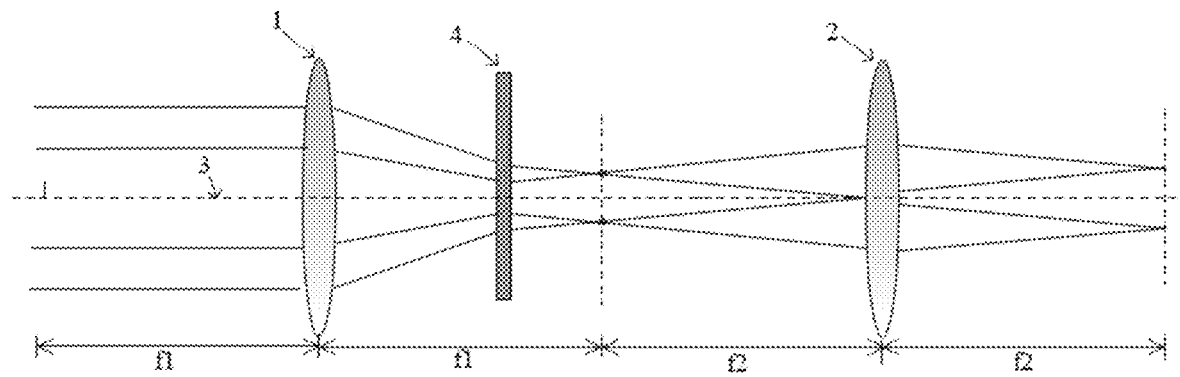
Figure 1:
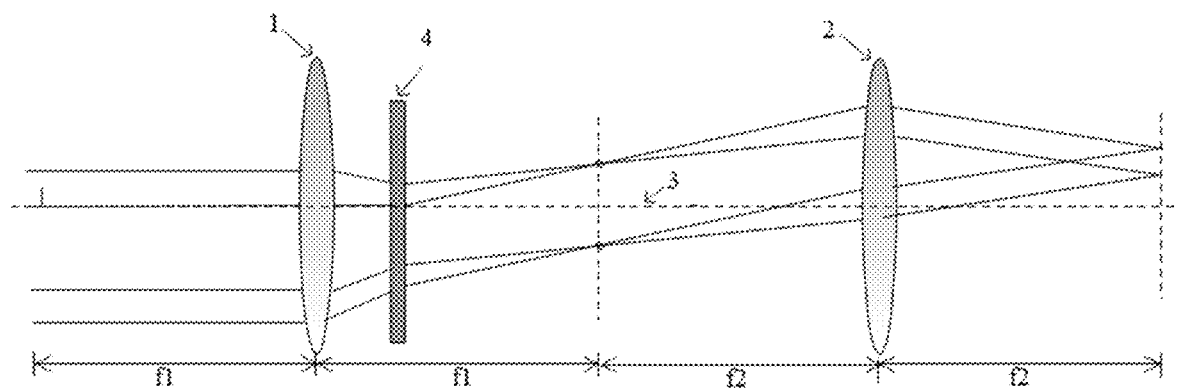

Embodiment 1: Real-Time Micro/Nano Optical
Field Generation System Incorporating the Spatial
Filter and a Single Phase Element In the embodiment, a real-time micro/nano optical field generation and manipulation system is shown in FIG. 1. An optical 4F system (having focal lengths of f1, f1, f2 and f2) comprises a first lens (set) 1, a second lens (set) 2 and a light wave manipulation optical component 4, and the light wave manipulation optical component 4 may be a binary optical element, a grating element, a holographic element or a metasurface element. Wherein a dashed line represents an optical axis 3 of the optical 4F system.

In the embodiment, if the light wave manipulation optical component 4 is a binary optical element, it has ±1-st diffracted lights without 0-th lights. Incidents lights selected by the spatial filter are converged after the first lens (set), and then pass through the binary optical element 4 to form ±1-st diffracted lights, and the ±1-st diffracted lights form two converged light spots respectively in a back focal plane of the first lens (set).

If the light wave manipulation optical component 4 is a micro/nano structure with a single period, its converged light spots in the back focal plane of the first lens (set) are symmetrical relative to the optical axis. Incident sub-wavefronts selected by a spatial filter interfere at different areas in an imaging plane of the optical 4F system after passing through the first lens (set). As shown in 1 (a) and (b), after spatial filtering, two different parts of incident lights interfere at different positions and areas in the imaging plane. If only the frequency of an interference pattern is changed, as shown in FIG. 1 (a), the incident sub-wavefronts are re-selected by the spatial filter with the phase element 4 moved along the optical axis, as shown in FIG. 1 (c), the frequency of the pattern is changed while the distribution area of the pattern is not changed.

Figure 2:
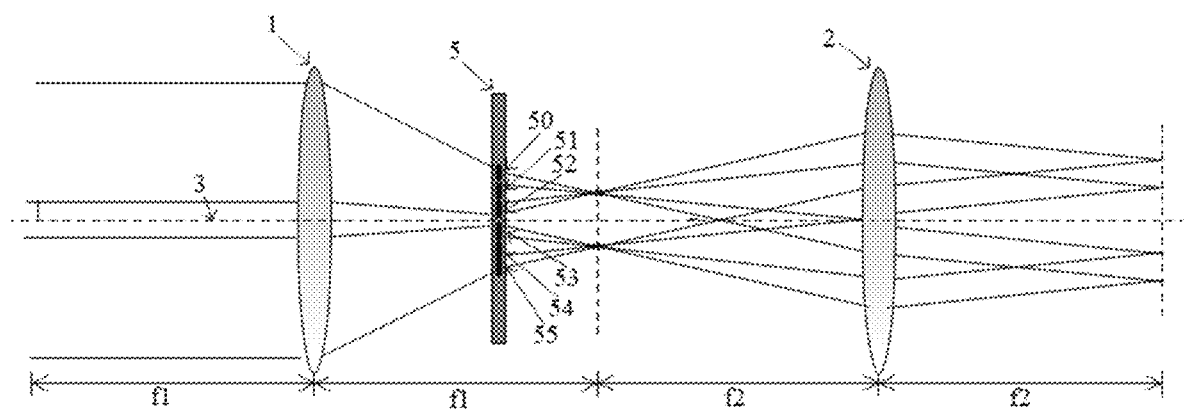
FIG. 2 shows a real-time micro/nano optical field generation system incorporating the spatial filter and a phase element with spatial variant structures in Embodiment 2 of the present disclosure.

Embodiment 2: Real-Time Micro/Nano Optical
Field Generation System Utilizing the Spatial Filter
and Phase Element with Space Variant Structures In the embodiment, a real-time micro/nano optical field generation and manipulation system is shown in FIG. 2. In an optical 4F system, a light wave manipulation optical component is phase element with space variant structures, which is formed by sequentially arranged sub-pixels 50, 51, 52, 53, 54 and 55. At least one of the sub-pixels 50, 51, 52, 53, 54 and 55 is a binary optical element, a grating element, a holographic element or a metasurface element; and structures of the sub-pixels may be identical or different.

Incident lights after the spatial filter, as shown in FIG. 2, are divided into an upper beam and a lower beam, converging through a first lens (set) 1 and then illuminating at the phase element 5. If the sub-pixels 50-55 of the phase element are binary optical elements with ±1 st diffracted lights, the diffracted lights form multiple beams of output lights after passing through a second lens (set) so as to form the optical field distribution with spatial variant parameters in an imaging plane of the 4F system; and an interference pattern and its distribution area are defined by the corresponding sub-pixels and the incident lights provided by the spatial filtering.

Embodiment 3: Real-Time Micro/Nano Optical
Field Generation System Incorporating the Spatial
Filter and Separate Phase Elements In the embodiment, a real-time micro/nano optical field generation and manipulation system is shown in FIG. 3 (a); in an optical 4F system, sub-elements 60, 61, 62 and 63 form a light wave manipulation optical component assemble, modulate multi-segments of sub-waves respectively in an optical 4F system, wherein at least one of the sub-elements 60, 61, 62 and 63 is a binary optical element, a grating element, a holographic element or a metasurface element; the sub-elements 60, 61, 62 and 63 may be either a periodic structure or an aperiodic structure; and the sub-elements 60, 61, 62 and 63 may be identical or different.

In the embodiment, the incident lights after the spatial filter are converged after passing through the first lens (set); if the phase elements are the binary optical elements with ±1-st diffracted lights. Corresponding diffracted lights form multiple output beams in a back focal plane of a second lens (set) so as to form optical field distribution with spatial variant parameters in an imaging plane of the system; and as shown in FIG. 3 (a), the interference pattern and its distribution area are defined by corresponding sub-pixels and the incident light selected by the spatial filtering.

Figure 3:
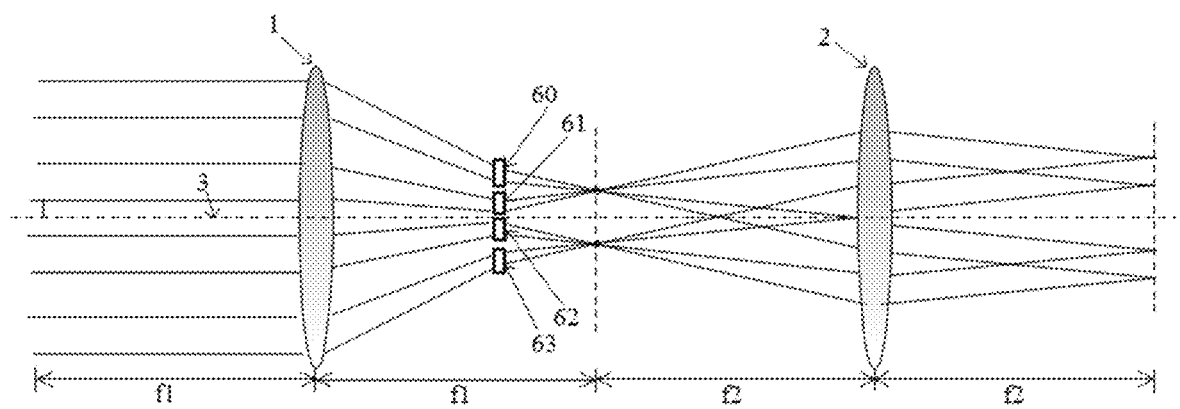
FIG. 3 shows real-time generation of a micro-nano optical field utilizing the spatial filter and a separate phase element in Embodiment 3 of the present disclosure.
Figure 3:
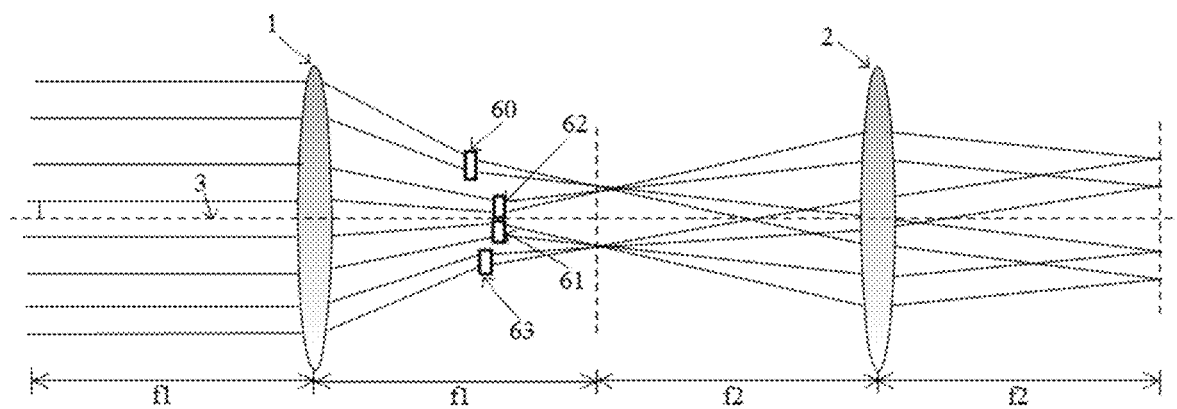

In the embodiment, as shown in FIG. 3 (b), without changing the pattern's position and area, its frequency can be changed by merely displacing the sub-element 60 vertically to an optical axis or axially along an optical axis direction; the pattern's frequency can be changed without changing its position and area by selection of the different incident parts with the spatial filter and the movements of the sub-element 63; and the pattern and its frequency can be changed by merely changing positions of the sub-elements 61 and 62.

Embodiment 4: Real-Time Micro/Nano Optical Field Generation System Incorporating a Spatial Filter and a Simple Phase Element In the embodiment, a real-time micro/nano optical field generation and manipulation system is shown in FIG. 4; and in an optical 4F system, a light wave manipulation optical component is a separated phase element 7, which can be a binary optical element, a grating element, a holographic element or a metasurface element.

In the embodiment, if the phase element 7 is a binary optical element without 0-th lights, it diffracts ±1-st lights. The collimated incident lights are converged through a first lens (set) and then diffracts into ±1st lights after the phase element, and then they interfere in an imaging plane of the system.

Figure 4:
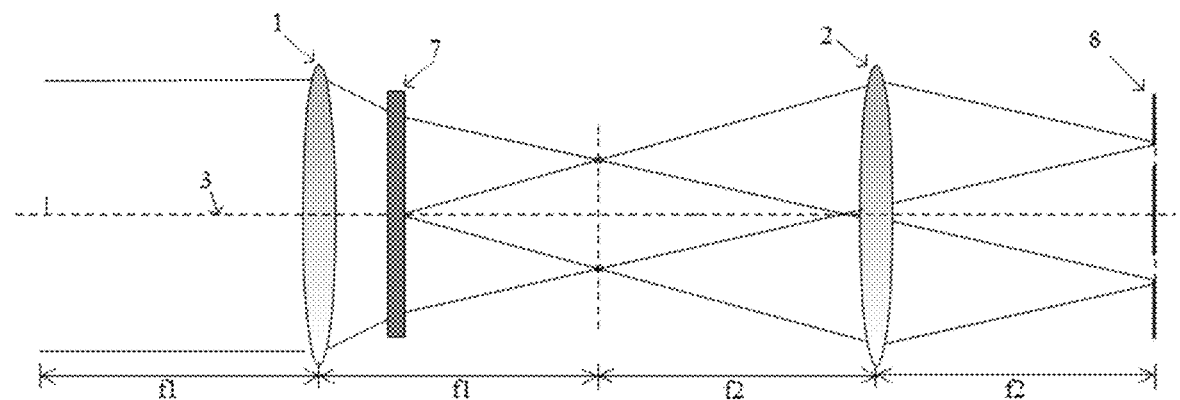
FIG. 4 shows a real-time micro/nano optical field generation system with the spatial filter and phase element with spatial variant structures in Embodiment 4 of the present disclosure.
Figure 4:
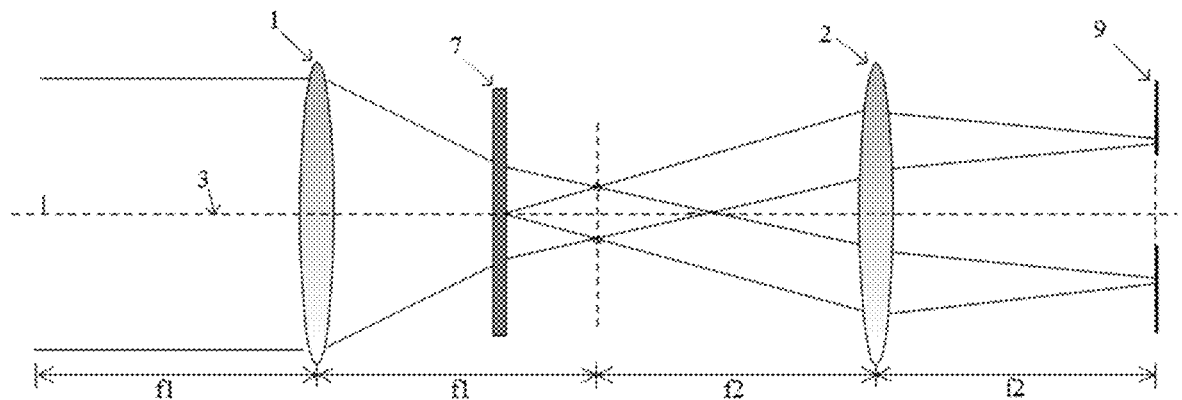

Spatial filtering units 8 are placed behind the system, as shown in FIG. 4 (a), and a high-spatial-frequency pattern is obtained in an unblocked area; and if the phase element 7 is displaced and rotated, spatial filtering units 9 are placed behind the system, and a low-spatial-frequency and variable-orientation pattern is obtained in the unblocked area.

In conclusion, the system of the present disclosure uses a laser to be the light source, uses a spatial filtering unit, an optical 4F system and an optical manipulation device to generate an interference pattern with real-time continuously adjustable structural parameters such as a pattern, a pattern position and area, a period, an orientation and a duty cycle, which can be integrated in a variety of lithography systems, fabricates micro/nano patterns with different structural parameters on positive and negative photoresist surfaces in real time, and provides the basis for the new functional material based on the micro-nano structure.

It should be noted that, in the present disclosure, the use of relational terms, such as first, second and the like are used solely to distinguish one from another entity or action without necessarily requiring or implying any actual such relationship or order between such entities or actions. Furthermore, the terms "comprises", "comprising", or any variation thereof are intended to cover a non-exclusive inclusion such that a process, method, article, or apparatus that comprises a list of elements does not include only those elements but may include other elements not expressly listed or inherent to such process, method, article, or apparatus. Elements limited by a sentence "comprising a . . . " shall not exclusive of other same elements in the process, method, article, or apparatus without limitation.

The foregoing descriptions is merely specific embodiments of the present disclosure, it should be noted that various improvements and modifications can be made by those ordinarily skilled in the art without departing from the principle of the present disclosure and shall fall within the protection scope of the present disclosure.

What is claimed is:

1. A real-time micro/nano optical field generation and manipulation system, comprising a light source, a spatial filtering unit, an optical 4F system and a light wave manipulation unit, wherein the optical 4F system comprises a first lens (set) and a second lens (set) sequentially arranged along a light path, the light wave manipulation unit is arranged between the first lens (set) and a second lens (set), and the light wave manipulation unit separately modulates incident lights or sub-wavefronts; the spatial filtering unit is located in front or back of the optical 4F system, which selects at least one of the incident sub-wavefronts, light wave manipulation elements, the effective area of the elements and different parts of optical field in the imaging plane, and then generates optical field distribution with real-time adjustable patterns, pattern positions, pattern areas and pattern structural parameters on a back focal plane of the system, wherein the light wave manipulation unit is a phase element with spatial variant structures, and the phase element comprises at least two differently structural distributed sub-pixels, different sub-pixels or different areas of the sub-pixels are selected through the spatial filtering unit to modulate the incident sub-wavefronts, and optical field distribution with different patterns, pattern positions and pattern areas is generated in a back focal plane of the system; and wherein each sub-wavefront is manipulated by time division spatial filtering and/or phase element phase change and/or rotation, and the optical field distribution with real-time adjustable structural parameters is generated in the back focal plane of the system.

2. The real-time micro/nano optical field generation and manipulation system according to claim 1, wherein the pattern has parameters including a composition, a position, an area and the like; and the pattern structural parameters comprise a period, an orientation, a phase or phase shift, and a duty cycle.

3. The real-time micro/nano optical field generation and manipulation system according to claim 1, wherein the optical field distribution is formed by one or more interference optical fields.

4. The real-time micro/nano optical field generation and manipulation system according to claim 1, wherein the composition, position, area, and structural parameters of the pattern are separately or simultaneously adjusted continuously in real time.

5. The real-time micro/nano optical field generation and manipulation system according to claim 1, wherein the spatial filtering unit is selected from a diaphragm, a grayscale mask or a programmable spatial filtering unit.

6. The real-time micro/nano optical field generation and manipulation system according to claim 1, wherein the filtering method of the spatial filtering unit comprises and is not limited to a time division multiplexing spatial filtering or a spatio-temporal multiplexing filtering.

7. The real-time micro/nano optical field generation and manipulation system according to claim 1, wherein the light source comprises a laser.

8. A manipulation method based on the real-time micro/nano optical field generation and manipulation system according to claim 1.

* * * * *